United States Patent
Boriskin et al.

(10) Patent No.: US 10,964,905 B2
(45) Date of Patent: Mar. 30, 2021

(54) ORGANIC LIGHT EMITTING DIODE CELL COMPRISING A SET OF RIGHT CIRCULAR HOLLOW CYLINDERS

(71) Applicant: InterDigital CE Patent Holdings, Paris (FR)

(72) Inventors: Artem Boriskin, Cesson-Sevigne (FR); Oksana Shramkova, Cesson-Sevigne (FR); Valter Drazic, Cesson-Sevigne (FR)

(73) Assignee: InterDigital CE Patent Holdings, Paris (FR)

( * ) Notice: Subject to any disclaimer, the term of this patent is extended or adjusted under 35 U.S.C. 154(b) by 0 days.

(21) Appl. No.: 16/377,275

(22) Filed: Apr. 8, 2019

(65) Prior Publication Data

US 2020/0321549 A1    Oct. 8, 2020

(51) Int. Cl.
*H01L 51/52*   (2006.01)
*G02B 5/02*   (2006.01)
*G02B 27/09*   (2006.01)

(52) U.S. Cl.
CPC ........ *H01L 51/5206* (2013.01); *G02B 5/0273* (2013.01); *G02B 27/0977* (2013.01); *H01L 51/5221* (2013.01)

(58) Field of Classification Search
CPC .......................................... H01L 51/5262–5278
See application file for complete search history.

(56) References Cited

U.S. PATENT DOCUMENTS 7,061,451 B2    6/2006 Kimura
7,139,109 B2    11/2006 Mukawa
(Continued)

FOREIGN PATENT DOCUMENTS

EP    1830422 A2    9/2007
EP    1860471 B1    11/2007
(Continued)

OTHER PUBLICATIONS

Adrian Kitai Chapter 6 "Organic Semiconductors, OLEDs, and Solar Cells" in "Principles of Solar Cells, LEDs, and Diodes: The Role of the PN Junction" John Wiley and Sons (2011).
(Continued)

*Primary Examiner* — Mariceli Santiago
(74) *Attorney, Agent, or Firm* — Invention Mine LLC

(57) ABSTRACT

It is proposed an organic light emitting diode (OLED) cell, comprising a cathode, an anode, the anode being positioned on a substrate, and wherein the organic light emitting diode cell further comprises between said cathode and said anode, an emissive layer and an conductive layer, that generate light when a difference of potential occurs between said cathode and said anode. The organic light emitting diode (OLED) cell further comprises a diffusion layer comprising a set of right circular hollow cylinders, wherein each right circular hollow cylinder being defined by at least a parameter R, named an external radius, and a parameter r, named an internal radius, wherein said parameter R is comprised in a first range $$\left[\lambda - \frac{30}{100}\lambda; \lambda + \frac{30}{100}\lambda\right]$$

with λ being a wavelength of an electromagnetic wave generated by said organic light emitting diode (OLED) cell, and wherein said parameter r is defined such that in a $$1 - \left(\frac{r}{R}\right)^2$$

(Continued)

is comprised in a second range [0.6; 0.8], and wherein each right circular hollow cylinder has a height that is comprised in a third range $$\left[0.2\frac{\lambda}{n}; 0.4\frac{\lambda}{n}\right],$$

wherein n corresponds to a refractive index of said diffusion layer.

22 Claims, 14 Drawing Sheets

(56) References Cited

U.S. PATENT DOCUMENTS

| | | | |
|---|---|---|---|
| 8,717,660 B2 | 5/2014 | Jian | |
| 9,508,903 B2 | 11/2016 | Fehrer | |
| 9,692,016 B2 | 6/2017 | Wehlus | |
| 2001/0026124 A1 | 10/2001 | Lui et al. | |
| 2004/0217702 A1 | 11/2004 | Garner | |
| 2006/0250084 A1* | 11/2006 | Cok | H01L 51/5253 313/512 |
| 2006/0278880 A1* | 12/2006 | Lee | H01L 33/22 257/79 |
| 2008/0079015 A1* | 4/2008 | Krummacher | F21V 14/003 257/98 |
| 2009/0015142 A1 | 1/2009 | Potts | |
| 2009/0072711 A1 | 3/2009 | Cina et al. | |
| 2013/0082244 A1 | 4/2013 | Heller et al. | |
| 2013/0168712 A1* | 7/2013 | Jeong | H01L 51/5275 257/98 |
| 2015/0077966 A1* | 3/2015 | Bessho | F21V 5/002 362/19 |
| 2015/0098243 A1 | 4/2015 | Li | |
| 2016/0218323 A1* | 7/2016 | Seo | H01L 51/5268 |
| 2019/0121176 A1* | 4/2019 | Lee | G02F 1/1336 |

FOREIGN PATENT DOCUMENTS

| | | |
|---|---|---|
| JP | 2002071931 A | 3/2002 |
| JP | 4389283 B2 | 12/2009 |
| WO | 2015092222 A1 | 6/2015 |

OTHER PUBLICATIONS

Jorg Frischeisen "Light Extraction in Organic Light-Emitting Diodes" Dissertation to obtain a doctoral degree in natural sciences—University of Augsburg (Jul. 26, 2011).

Machine translation of the JP publication No. JP4389283, published on Dec. 24, 2009, 16 pages.

\* cited by examiner

RGB emitters

Blue emitter + Converters

White emitter + Filtre z-x cross section: 30°
Without phase-filter
With phase-filter
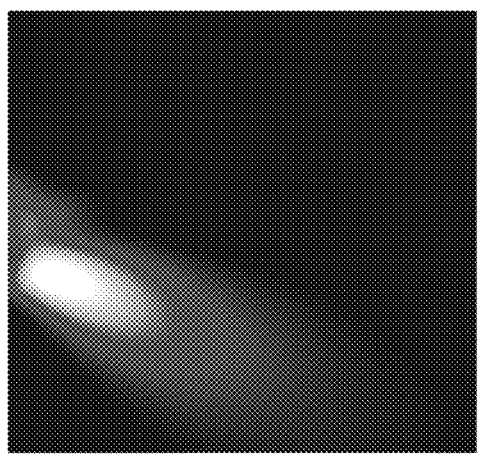
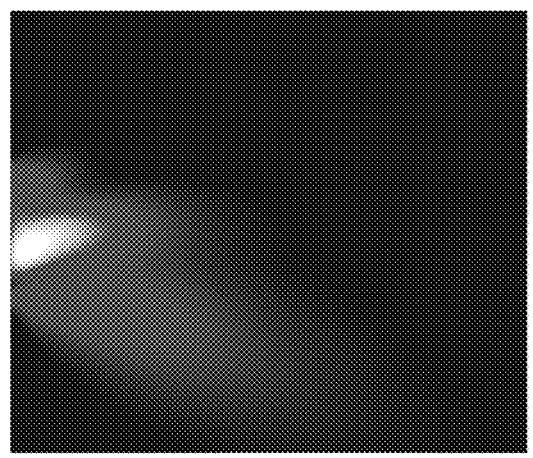
Figure 9A
Figure 9B z-x cross section: 45°

Without phase-filter

With phase-filter z-x cross section: 60°
Without phase-filter
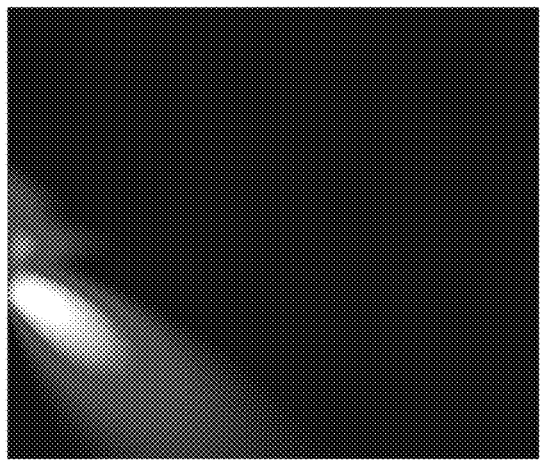
With phase-filter
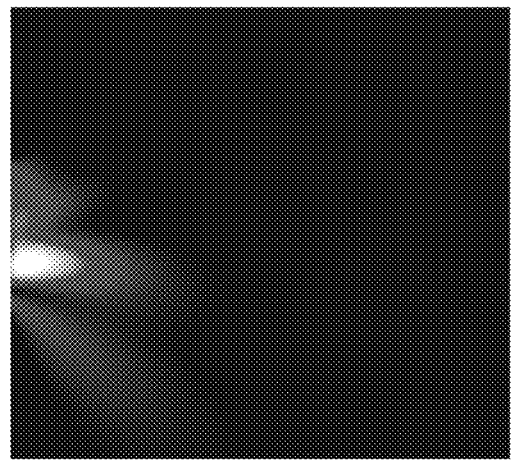
Figure 11A
Figure 11B z-x cross section: 80°
Without phase-filter                With phase-filter
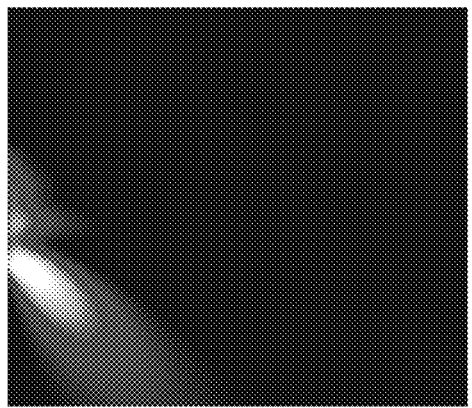 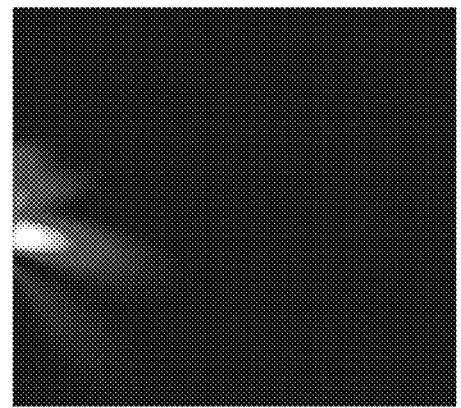
Figure 12A                          Figure 12B

ORGANIC LIGHT EMITTING DIODE CELL COMPRISING A SET OF RIGHT CIRCULAR HOLLOW CYLINDERS

TECHNICAL FIELD

The disclosure relates to display devices that comprise OLED cells (which stands for "Organic Light Emitting Diode"). It relates to a specific architecture of an OLED cell for reducing the loss of light during the display of content.

BACKGROUND

This section is intended to introduce the reader to various aspects of art, which may be related to various aspects of the present invention that are described and/or claimed below. This discussion is believed to be helpful in providing the reader with background information to facilitate a better understanding of the various aspects of the present invention. Accordingly, it should be understood that these statements are to be read in this light, and not as admissions of prior art.

An OLED cell usually comprises a stack of high index layers sandwiched between a glass plate and a doped silicium backplane, or two glass plates. Alternatively, the layers can be deposited on a flexible support.

Reminders on OLED cells are provided in the Chapter 6 of the book entitled *"Principles of Solar cells, LEDs and Diodes; The role of the PN junction"* by Adrian Kitai.

To sum-up, usually, an OLED cell comprises an anode positioned on a glass substrate, a cathode, and between the anode and the cathode, active layers that comprise an electron transport layer (ETL) and a hole transport layer (HTL). Generally, the anode is made of a transparent material in order to allow light to leave active layers. For example, the anode can be made of an indium tin oxide (ITO). In a variant, a light emitting material (LEM) can also be positioned between the HTL and the ETL. It should be noted that the color emitted by an OLED is determined or linked by the nature of the LEM. Hence, it is possible to choose specific material of the LEM in order to obtain an OLED cell that only delivers monochromatic electromagnetic wave (i.e. monochromatic light). In some variant, some color converters or color filters are positioned close to the anode in order to filter the light coming from the light emitting material (that can deliver for example only blue light or white light). The FIG. 2 presents some of these architectures for an OLED cell.

Usually, in OLED cells, there is only a small portion of light (that corresponds to the emission of a photon when an electron and a hole recombine somewhere within the stack of layers in the high index medium) that gets out of the cell.

Indeed, if the direction of propagation of a generated or emitted photon is above a critical angle (i.e. the emitted photon does not propagate in the light cone or solid angle 101 in the FIG. 1 of the present document), it gets trapped within a denser medium. If we simplify the problem with the hypothesis that the stacks have one sole refractive index n, then the critical angle can be defined as:

$$\theta_c = \arcsin\frac{1}{n}$$

For an electron-hole recombination, all directions are possible for the propagation of the photon, the emission is isotropic (see the sphere in FIG. 1). The photon can escape the structure if it is emitted in the solid angle 101 on FIG. 1, but it can as well escape if it is emitted backwards within the same solid angle value. The bottom of the cell has either a reflector for top emitting diodes, or it is transparent so that the total solid angle of emitted photos that escape from the structure is:

$$\Omega = 2 \times 2\pi(1-\cos\theta_c)$$

and the percentage of the light getting out of the cell (proportional to $4\pi$ steradians) is:

$$\eta = 1 - \sqrt{1-\left(\frac{1}{n}\right)^2}$$

For an average index of refraction of 1.7 within the diode media, the light extraction efficiency is only of $\eta=0.19$, meaning that only 19% of the generated light gets out. It has also to be considered also that one of the top layer is made of ITO which has a very high index of refraction and also a big variation within the visible band. It has an index above 2.0 in the deep blue, at blue-ray type wavelength, it has an index of 1.9 in the green and 1.8 in the red while near IR (infra-red) is around 1.6.

Hence, the development of techniques for improving the light extraction within OLED cells is a hectic research topic.

In order to achieve such goal, a first technique (described for example in document US 2001/0026124) relying on the light extraction by scattering was developed. Alternatively, a second technique that relies on the light extraction by refraction as proposed for example in documents JP2002-071931 and US2001-0026124 was investigated. Furthermore, a third technique which performs light extraction by using geometric patterns was elaborated for example in document US 2009/0072711.

The proposed technique is an alternative to these technical solutions.

SUMMARY OF THE DISCLOSURE

References in the specification to "one embodiment", "an embodiment", "an example embodiment", indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

The present disclosure is directed to an organic light emitting diode (OLED) cell, comprising a cathode, an anode, the anode being positioned on a substrate, and wherein the organic light emitting diode cell further comprises between said cathode and said anode, an emissive layer and an conductive layer, that generate light when a difference of potential occurs between said cathode and said anode, and wherein the organic light emitting diode (OLED) cell further comprises a diffusion layer comprising a set of right circular hollow cylinders, wherein each right circular hollow cylinder being defined by at least a parameter R, named an external radius, and a parameter r, named an internal radius, wherein said parameter R is comprised in a first range $$\left[\lambda - \frac{30}{100}\lambda; \lambda + \frac{30}{100}\lambda\right]$$

with λ being a wavelength derived from an electromagnetic wave generated by said organic light emitting diode (OLED) cell, and wherein said parameter r is defined such that in a $$1 - \left(\frac{r}{R}\right)^2$$

is comprised in a second range [0.6; 0.8], and wherein each right circular hollow cylinder has a height that is comprised in a third range $$\left[0.2\frac{\lambda}{n}; 0.4\frac{\lambda}{n}\right],$$

wherein n corresponds to a refractive index of said diffusion layer.

Hence, according to the present disclosure, these right circular hollow cylinders have a function of phase filters embedded in a structure (i.e. the diffusion layer). Indeed, a right circular hollow cylinder can change the orientation of an incident electromagnetic wave (that is incident on such structure with an angle greater than 30 degrees, and below than 80 degrees, said angle being defined compared to the normal of the diffusion layer and the propagation direction of the electromagnetic wave. In addition, the phase shift is obtained due to the design of such structure.

In a preferred embodiment, the diffusion layer further comprises metallic reflectors that are positioned between said right circular hollow cylinders.

In a preferred embodiment, the OLED cell further comprises a light emitting material layer positioned between said emissive layer and said conductive layer.

In a preferred embodiment, the light emitting material can generate a monochromatic electromagnetic wave associated with said wavelength λ, and wherein said wavelength λ is comprised between 450 nm and 495 nm. In such case, λ is roughly the same than the wavelength of the electromagnetic wave generated by said organic light emitting diode.

In a preferred embodiment, the light emitting material can generate a polychromatic electromagnetic wave.

In a preferred embodiment, the OLED cell further comprises a color filter or a color converter positioned at an edge of said diffusion layer. In such case, λ is not equal to the wavelength of the electromagnetic wave generated by said organic light emitting diode, but is defined as a function of it and from features associated with the color filter or the color converter. In a sense, it is derived from the electromagnetic wave generated by said organic light emitting diode.

In a preferred embodiment, each of said right circular hollow cylinder is made of a dielectric material in its internal part, and is filled in with a gas in another part.

In another embodiment of the disclosure, it is proposed a display device that comprises a set of organic light emitting diode (OLED) cells as mentioned previously. In a variant, such display device can be comprised in a mobile phone, and/or a wearable device (such as smartwatch, see through glasses, Head-mounted display devices, etc.).

BRIEF DESCRIPTION OF THE DRAWINGS

The above and other aspects of the invention will become more apparent by the following detailed description of exemplary embodiments thereof with reference to the attached drawings in which:

FIGS. 9A and 9B present a cross-section of a diffraction field pattern generated, along a plane z-x, by an aperture, from an incident plane electromagnetic wave at an angle of 30° with respect to a normal direction z, respectively without a phase filter, and with a phase filter according to one embodiment of the disclosure;

FIGS. 11A and 11B present a cross-section of a diffraction field pattern generated, along a plane z-x, by an aperture, from an incident plane electromagnetic wave at an angle of 60° with respect to a normal direction z, respectively without a phase filter, and with a phase filter according to one embodiment of the disclosure;

FIGS. 12A and 12B present a cross-section of a diffraction field pattern generated, along a plane z-x, by an aperture, from an incident plane electromagnetic wave at an angle of 80° with respect to a normal direction z, respectively without a phase filter, and with a phase filter according to one embodiment of the disclosure.

DETAILED DESCRIPTION

Figure 1:
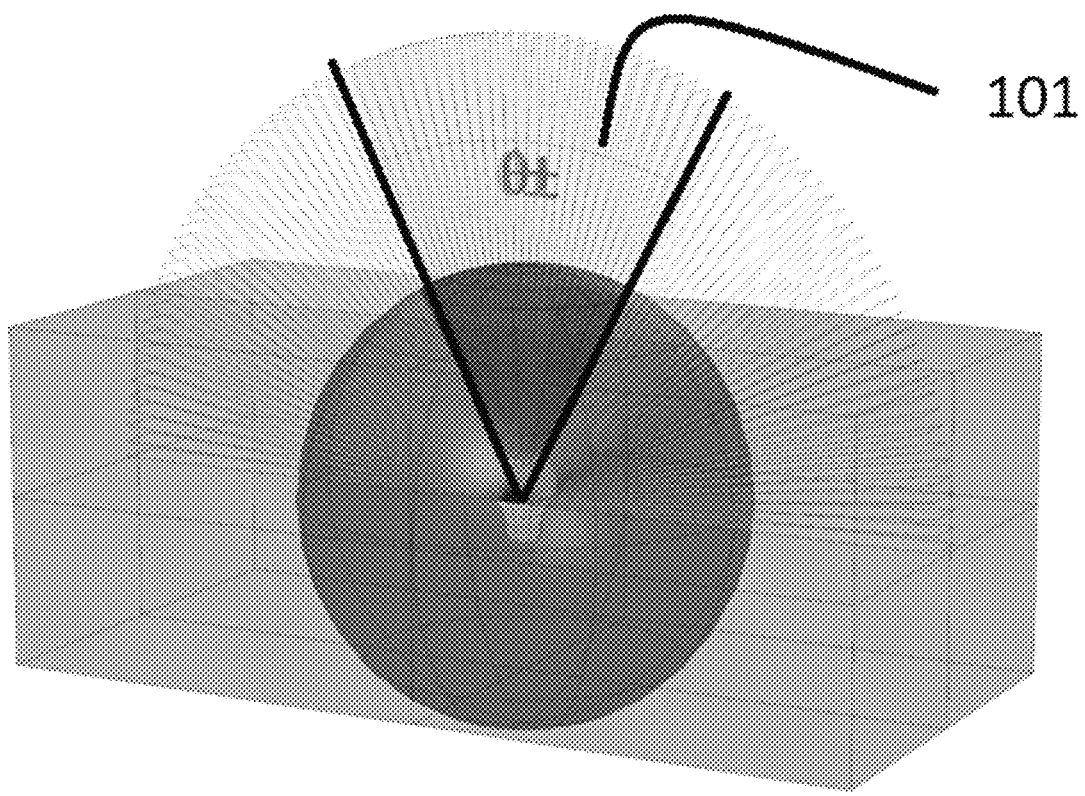
FIG. 1 presents the loss of light that occurs in an OLED cell.

FIG. 1 presents the loss of light that occurs in an OLED cell. Indeed, most of the light (either monochromatic or polychromatic) generated by an OLED cell does not go out of the OLED cell, and is trapped inside the OLED cell. For example, the light that has a propagation direction is associated with a propagation angle θ, and according to the value of such propagation angle compared to a critical angle $θ_c$, the light is either trapped or is extracted from the OLED cell. For example, in FIG. 1, only the light that belongs to the cone of light referenced 101 is extracted from the OLED cell. More details concerning the light trapping within an OLED cell are provided in the document entitled: "*Light extraction in organic light-emitting diodes*" by Jörg Frischeise, in a Dissertation from the University of Augsburg, in 2011.

Figure 2A:
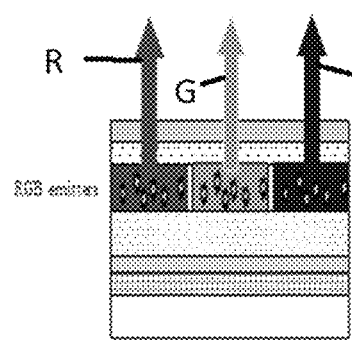
FIGS. 2A, 2B and 2C present different OLED cell structures, where the obtaining of a specific color is obtained from three different architectures.
Figure 2B:
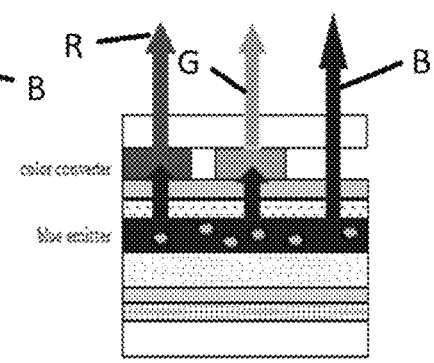
Figure 2C:
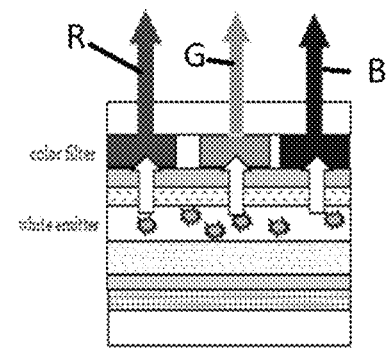

FIGS. 2A, 2B and 2C presents different OLED cell structures, where the obtaining of a specific color is obtained from three different architectures.

More precisely, in FIG. 2A, each OLED cell, within a display device, comprises a light emitting material that is associated with only wavelength. For example, one light emitting material is associated with a wavelength that belongs to the range [625 nm; 740 nm] (i.e. a red color, referenced R), then another light emitting material is associated with a wavelength that belongs to the range [495 nm; 570 nm] (i.e. a green color, referenced G), and at least another light emitting material is associated with a wavelength that belongs to the range [466 nm; 490 nm] (i.e. a blue color, referenced B). Hence, in such architecture, it is not necessary to add a filter or a converter for obtaining an RGB light emitter.

In FIG. 2B, each OLED cell, within a display device, comprises a light emitting material that is associated with only wavelength that belongs to the range [466 nm; 490 nm] (i.e. a blue color, referenced B). Then, for obtaining an RGB display device, color converters are positioned at the edge of the transparent anode for obtaining the red hue and the green hue. In such architecture, it is not necessary to add a specific converter for the blue hue.

In FIG. 2C, each OLED cell, within a display device, comprises a light emitting material that generate a white light (being a polychromatic electromagnetic wave). Then, for obtaining an RGB display device, some color filters are positioned at the edge of each transparent anode.

The technique described in the present document can be applied to these architectures.

Figure 3A:
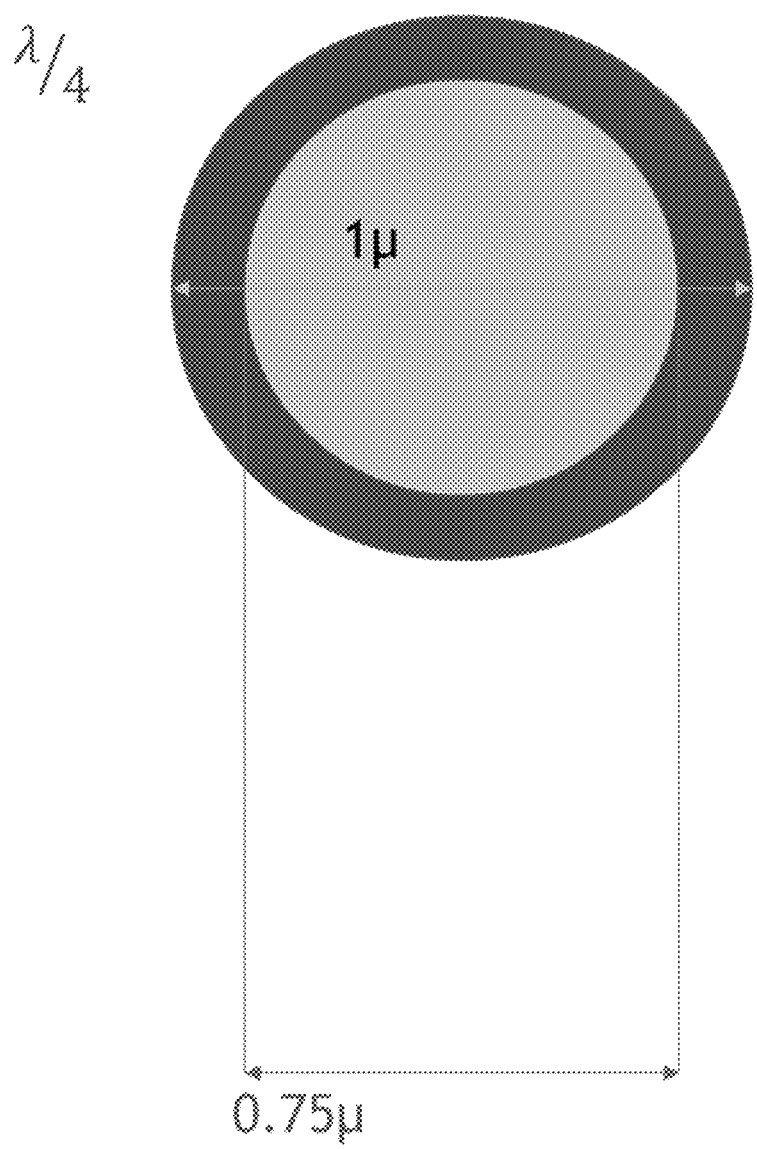
FIG. 3A presents a top view of a right circular hollow cylinder according to the present disclosure that can be put in a diffraction layer in an OLED cell according to one embodiment of the disclosure.

According to one embodiment of the disclosure, it is proposed to add at the edge of a transmitting element (being either the anode or the cathode) in an OLED cell, a diffusion layer. The diffusion layer can be made of a dielectric material. It is proposed to add within such diffusion layer, several right circular hollow cylinders. For example, a right circular hollow cylinder having specific parameters disclosed in FIG. 3(a) can be used in one embodiment of the disclosure. Indeed, FIG. 3A presents a top view of a right circular hollow cylinder according to the present disclosure that can be put in a diffraction layer in an OLED cell according to one embodiment of the disclosure. Such right circular hollow cylinder acts as a phase filter. It has a disk-shaped aperture of 1 μm width for a wavelength of 0.5 μm. At the rim of the aperture, there is a quarter wave retarder.

Figure 3B:
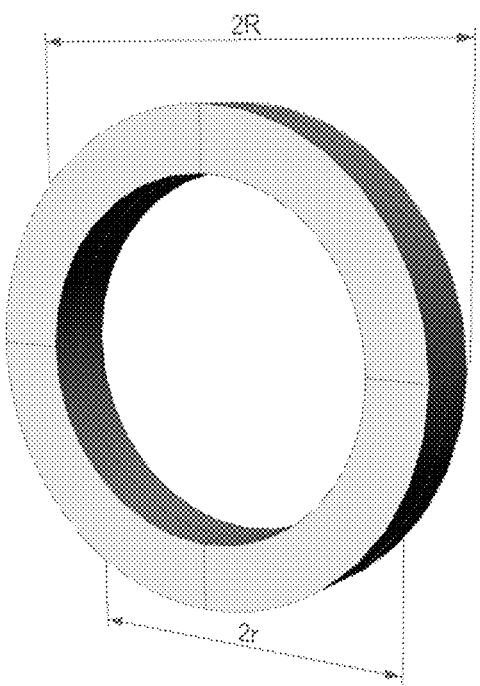
FIG. 3B presents a perspective view of a right circular hollow cylinder according to the present disclosure that can be put in a diffraction layer in an OLED cell according to one embodiment of the disclosure.

FIG. 3B presents a perspective view of a right circular hollow cylinder according to the present disclosure that can be put in a diffraction layer in an OLED cell according to one embodiment of the disclosure.

Figure 3C:
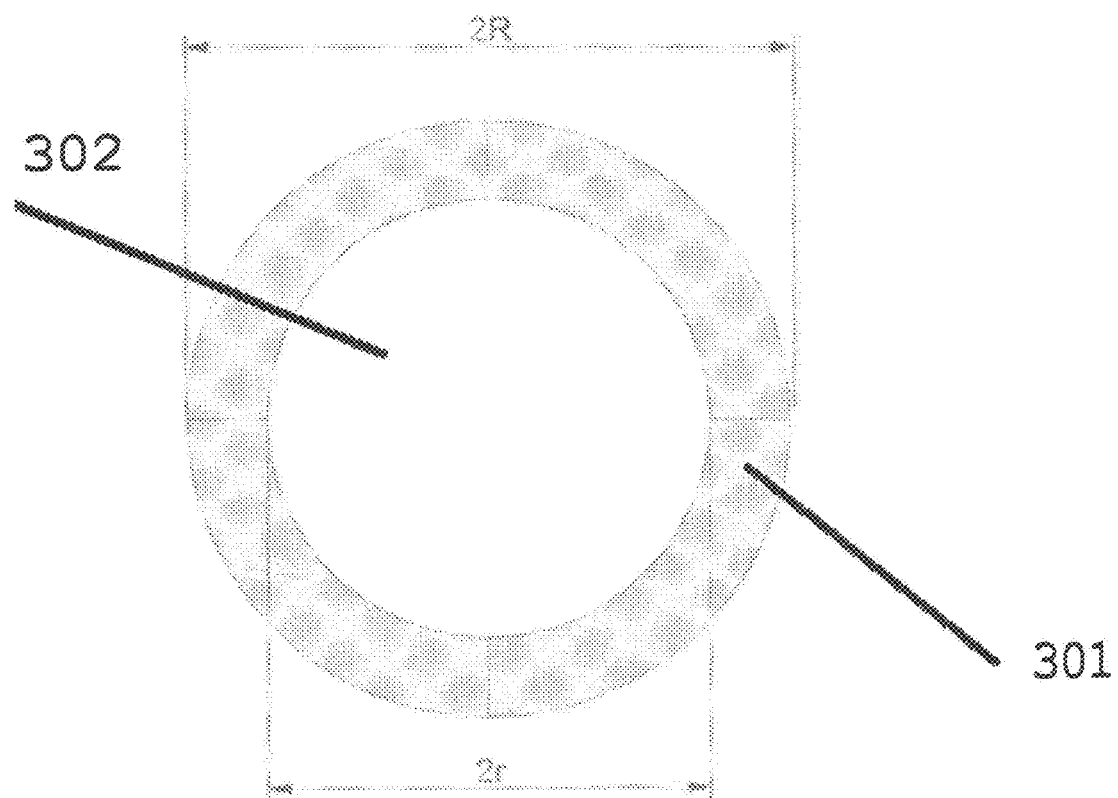
FIG. 3C presents another top view of a right circular hollow cylinder according to the present disclosure that can be put in a diffraction layer in an OLED cell according to one embodiment of the disclosure.

FIG. 3C presents another top view of a right circular hollow cylinder according to the present disclosure that can be put in a diffraction layer in an OLED cell according to one embodiment of the disclosure.

A right circular hollow cylinder according to the disclosure (as depicted in FIGS. 3(b) and 3(c)) is defined by a parameter R, named an external radius, and a parameter r, named an internal radius. The parameter R is comprised in a first range $$\left[\lambda - \frac{30}{100}\lambda; \lambda + \frac{30}{100}\lambda\right]$$

with λ being a wavelength derived from an electromagnetic wave generated by the OLED cell in which the right circular hollow cylinder is embedded. The parameter r is defined such the value of $$1 - \left(\frac{r}{R}\right)^2$$

is comprised in a second range [0.6; 0.8]. In addition, the circular hollow cylinder has a height that is comprised in a third range $$\left[0.2\frac{\lambda}{n}; 0.4\frac{\lambda}{n}\right],$$

wherein n corresponds to a refractive index of the diffusion layer in the OLED cell.

Figure 4:
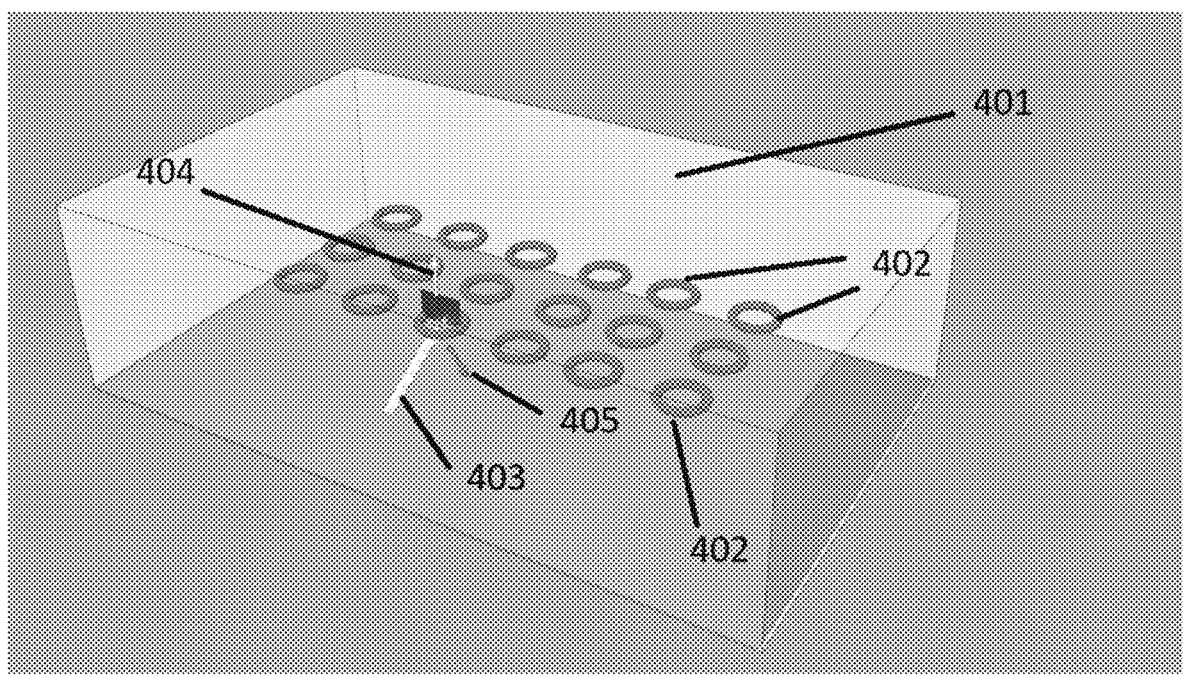
FIG. 4 presents in a schematic way an exemplary configuration for positioning several right circular hollow cylinders according to the disclosure within a diffraction layer associated with an OLED cell.

Moreover, in one embodiment of the disclosure, the right circular hollow cylinder of FIG. 3(c) is made of a dielectric material in its internal part referenced 302, and is filled in with a gas in another part referenced 301. Hence, the part 301 of the right circular hollow cylinder can be viewed as a cavity within a dielectric structure, that is filled in with a gas (such as air). FIG. 4 presents in a schematic way an exemplary configuration for positioning several right circular hollow cylinders according to the disclosure within a diffraction layer associated with an OLED cell.

In a variant, the phase filters or right circular hollow cylinders can be embedded into different layers. Indeed, they do not need to be all in the same one. In such variant, the layers can be stacked one on top of the other or stacked in quincunx.

In another embodiment of the disclosure, the right circular hollow cylinders comprised in a diffusion layer of an OLED cell have all the same dimensions.

In another embodiment of the disclosure, the right circular hollow cylinders comprised in a diffusion layer of an OLED cell have not necessary the same dimensions.

In a variant, the density of the right circular hollow cylinders within an OLED cell is homogeneous. In another embodiment of the disclosure, more right circular hollow cylinders are present close to the center of the diffusion layer compared to the edge of the diffusion layer.

The phase filters or right circular hollow cylinders can be realized as a quarter-wave retarder at the outer rim of the aperture, but also as a three-quarter wave accelerator when embedded in denser media. For instance, the accelerating phase filter can be made of a hollow disk of a thickness calculated to achieve a phase difference of ¾ of a wavelength with respect to the edge media.

The thickness or the material of the phase retarder must be adjusted for each emitting wavelength. Which is to mean that it will be different for the red, green or blue cell. A retarder's thickness is calculated such as:

$$\varphi = \frac{2\pi}{\lambda} nd = \frac{2\pi}{4} \Leftrightarrow d = \frac{\lambda}{4n}$$

for a quarter-wave retarder.

In the following, some details concerning the function of a right circular hollow cylinder element according to one embodiment of the disclosure are described. In order to grasp the concept of the present disclosure, it is necessary to develop some reminders on the scalar diffraction theory. Indeed, the purpose of such right circular hollow cylinder element is to reorient an incident plane wave into another direction more favorable to light extraction. The scalar theory of diffraction can explain such phenomenon.

The scalar diffraction theory has Maxwell integral equations as basis. Usually, emitting dipoles can have different orientations: s, p and z and therefore, it is in principle not possible to describe the problem by scalar waves only. We should at least assume three different orientations for the wave. Nevertheless, nowadays OLED layers have a kind of dipole alignment layer at the recombining area. The alignment layer has the property to privilege only dipoles radiating into one direction. It should be noted that a radiation which is not contributing at all to light emission toward the extraction cone can exist, and most of the radiation is lost by tunneling into the layers. Therefore, z oriented dipoles should be avoided. The alignment layer favors either s or p dipole orientation. In other disciplines, s and p orientations are called TE or TM mode. With such an alignment layer, the light output is hence augmented, and we can apply the scalar theory to the wave propagation just for one orientation of the emission, assuming moreover that all components of the E and B field behave the same.

Calculation of Diffraction Patterns by an Aperture

The Rayleigh-Sommerfeld integral is used to calculate the diffraction pattern of an aperture at any distant plane.

Figure 5:
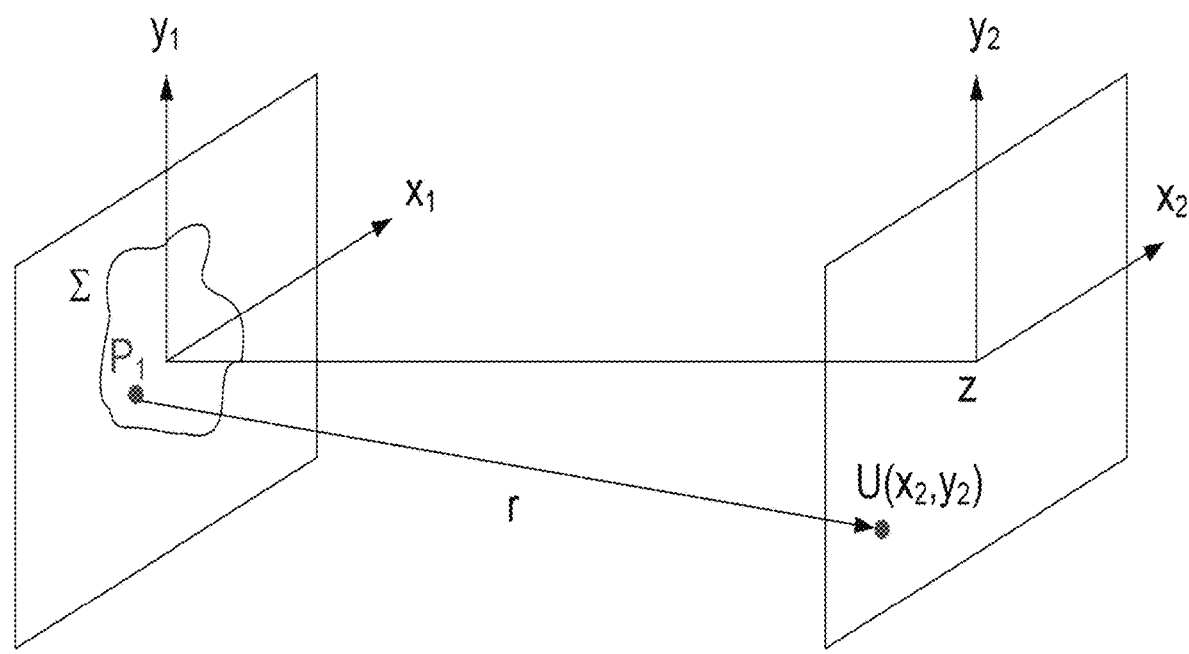
FIG. 5 presents a simplified model for determining a diffraction field pattern via a given aperture.

FIG. 5 presents a simplified model for determining a diffraction field pattern via a given aperture. More precisely, the aperture $\Sigma$ is illuminated by a plane wave. The aperture is located on a plane which is provided by an orthonormal coordinate system $(x_1, y_1)$. The point $P_1$ belongs to the aperture $\Sigma$. There is a receiving plane at the distance z, with the coordinate system $(x_2, y_2)$. We wish to calculate the field U at the point $P_2(x_2, y_2)$. The distance r is the distance between $P_1$ and $P_2$.

The expression of the field at $P_2$ is:

$$U(x_2, y_2) = \frac{jA}{\lambda} \int\int_{P_1 \in \Sigma} z \frac{e^{jkr}}{r^2} dP_1$$

So, thanks to the previous expression, which is the Rayleigh-Sommerfeld scalar diffraction integral for a plane wave orthogonal to E, at the plane $(x_2, y_2)$, it is possible to determine or compute the 3D diffraction pattern by varying the distance z.

Figure 6:
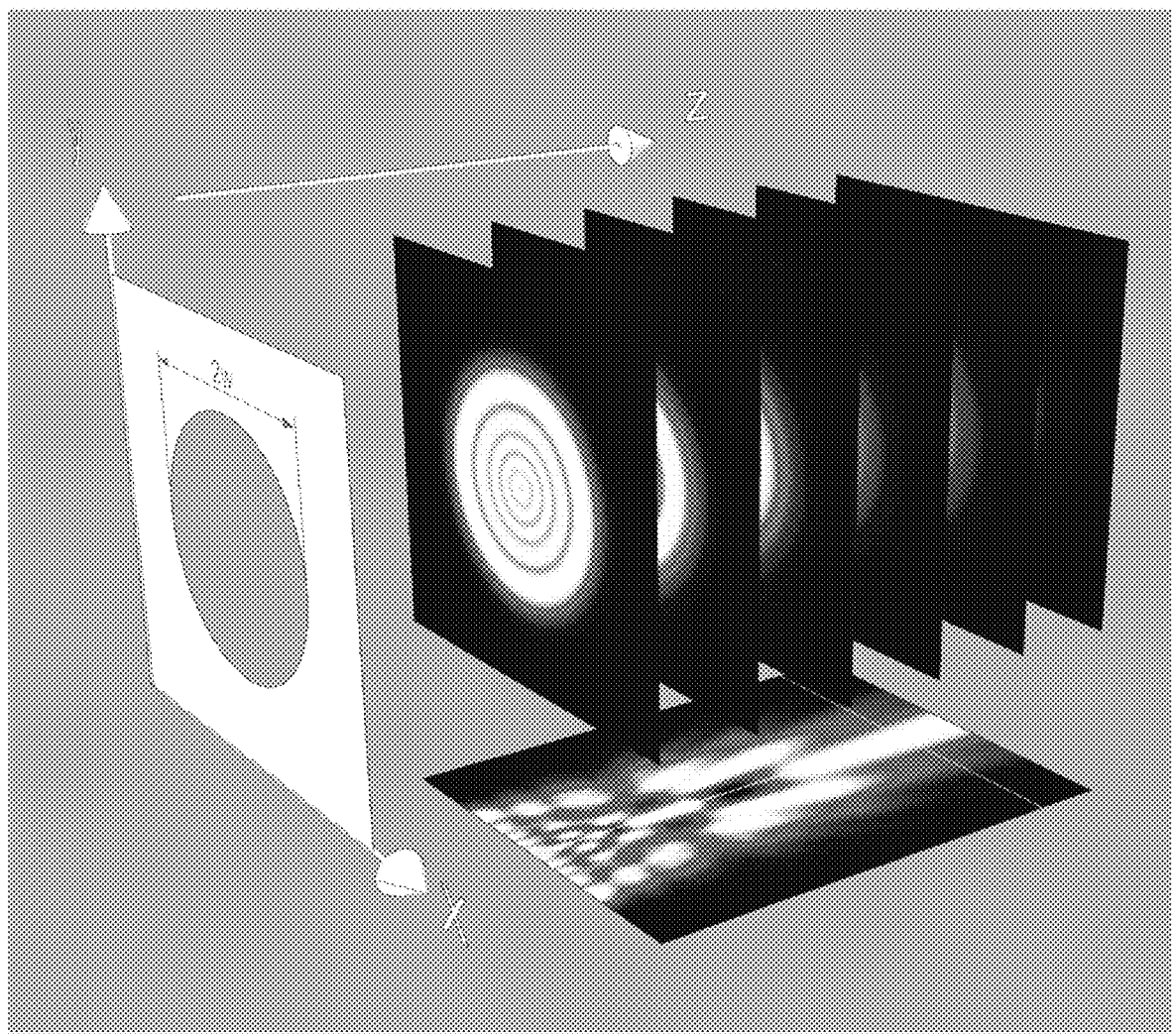
FIG. 6 presents an example of a sampling of a diffraction field pattern for a given aperture (having a disk shape) in the z direction or axis (six sections or samples) and in the x direction or axis (one sample)

FIG. 6 presents an example of a sampling of a diffraction field pattern for a given aperture (having a disk shape) in the z direction or axis (six sections or samples) and in the x direction or axis (one sample).

Indeed, a section of the diffraction field pattern can be obtained by setting z=constant and let the parameters $x_2$ and $y_2$ varying.

But we can also calculate a slice, by setting $y_2$=constant and varying $x_2$ and z and the FIG. 6 shows the example of one slice for y=0.

Cross-Checking the Diffraction Patterns with Results from Well-Known Software Packages Before trying to apply the previous formalism to our design of phase filters (or right circular hollow cylinders), we should at least check that the results are comparable with some commercial packages which use for instance Finite Domain Time Discrete (FDTD) calculations to solve for Maxwell differential equations and calculate the field where needed. This has been done by comparing the results of a slice calculation for diffracting apertures of different sizes. The reason why this needs to be checked is that the condition for using the Rayleigh-Sommerfeld scalar diffraction integral are not met: the paraxial condition is not met so that in principle, it should not be used for the calculation of the near field. But a lot of literature do report also that this diffraction theory has proved to deliver very good approximate results even if the basic hypothesis is not met. So, to validate the usage of our mathematical tools, we will compare the slices of diffraction patterns by disk shaped apertures of different sizes: bigger than the wavelength and in the range of the wavelength, keeping in mind that scalar diffraction theory not only should struggle because of the violation of the paraxial constrain but also because the aperture should be multiple times bigger than the wavelength. To quantify those constrains, the literature defines a value called the Fresnel Number "F" which defines the relative sizes of the aperture and distance from the aperture compared to the wavelength:

$$F = \frac{w^2}{\lambda z}$$

Where w is the biggest size of the diffracting aperture, $\lambda$ is the wavelength and z the distance of the receiving plane.

In order to use the scalar diffraction theory, F must be chosen such as F<<1. But it has been noticed in the literature that it can lead to accurate results for F~1 and we will show that in our cases, it can also do well in a reasonable near field for F<10.

Figure 7A:
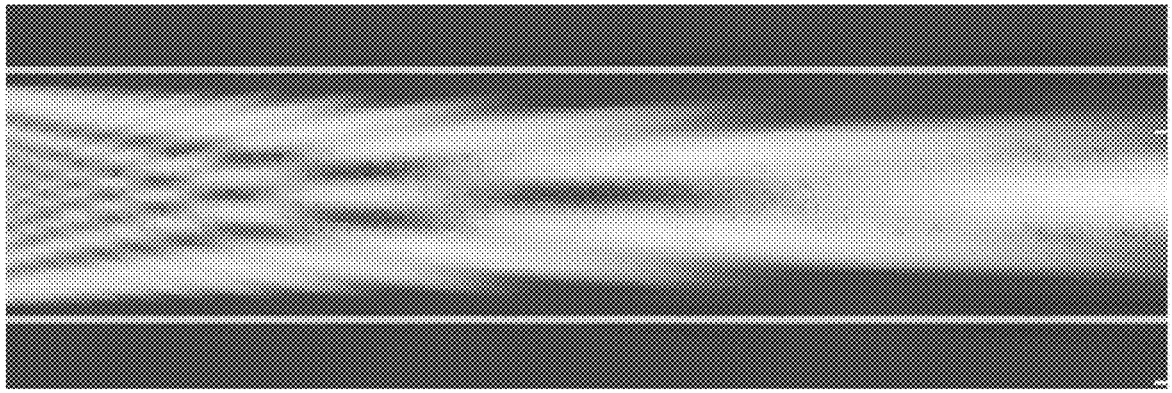
FIGS. 7A and 7B present a sample of a diffraction field pattern (according to the x direction or axis) generated by an approximatively 10 µm aperture and obtained respectively via a Comsol simulation, and a computation using the Rayleigh-Sommerfeld diffraction integral.
Figure 7B:
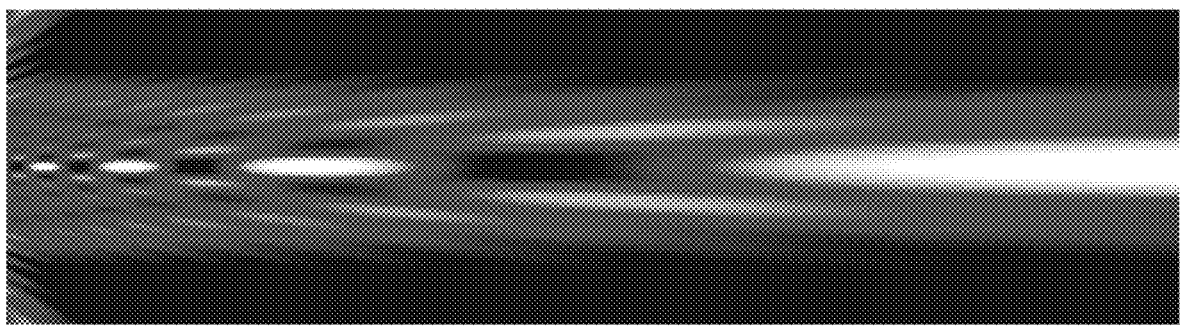

FIGS. 7A and 7B present a sample of a diffraction field pattern (according to the x direction or axis) generated by an approximately 10 μm aperture and obtained respectively via a Comsol simulation, and a computation using the Rayleigh-Sommerfeld diffraction integral. More precisely, it is therefore possible to compare slices of the diffraction pattern in the very near field for apertures of w=10.3 and 1 μm.

Figure 8A:
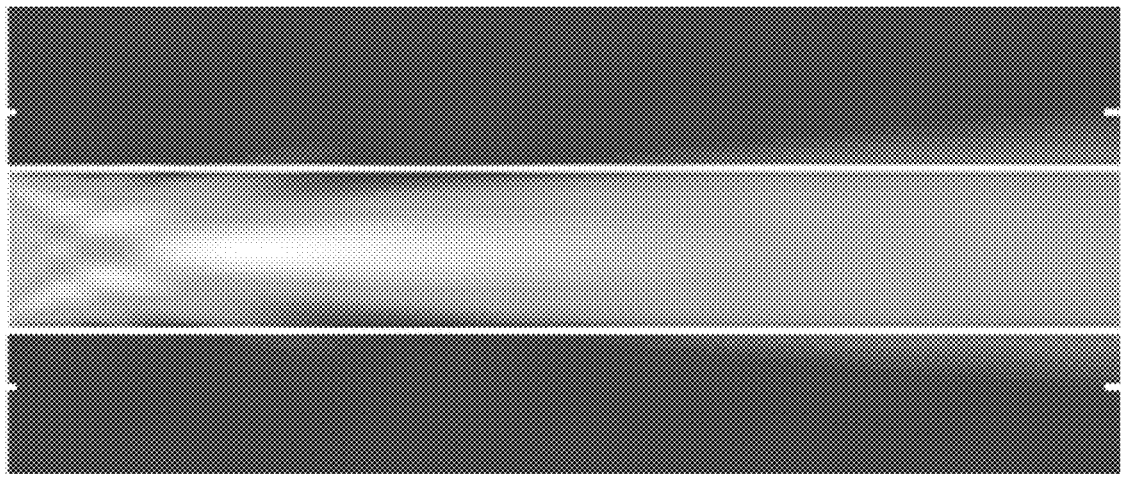
FIGS. 8A and 8B present a sample of a diffraction field pattern (according to the x direction or axis) generated by a 03 µm aperture and obtained respectively via a Comsol simulation, and a computation using the Rayleigh-Sommerfeld diffraction integral.
Figure 8B:
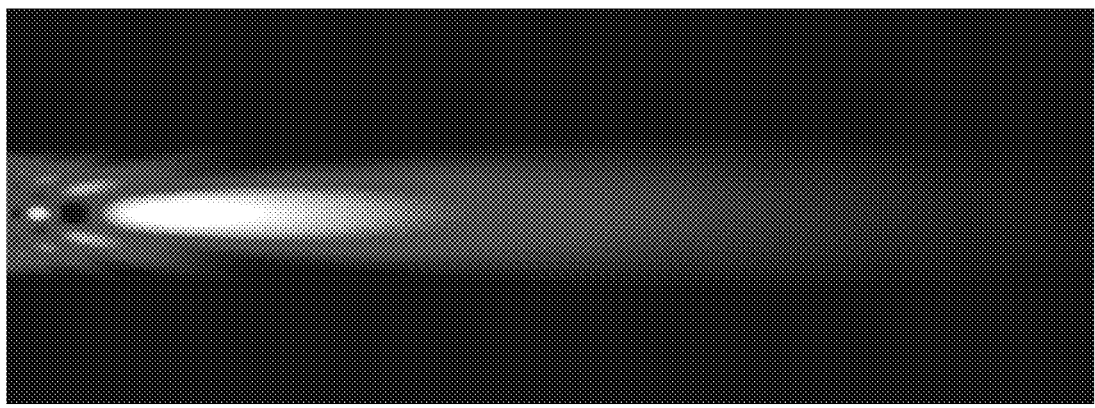

FIGS. 8A and 8B present a sample of a diffraction field pattern (according to the x direction or axis) generated by a 03 μm aperture and obtained respectively via a Comsol simulation, and a computation using the Rayleigh-Sommerfeld diffraction integral.

The scaling of the values in the FIGS. 7A, 7B, 8A and 8B is not the same because the calculations come from different softwares, but it can be seen that the results match with a remarkably high precision and we can use our technique to calculate diffraction figures with reasonable confidence even in the near field.

Nonlinear Light Deviation by Diffracting Phase Filters

As previously said, we are aiming at a solution for enhancing the light-extraction efficiency from an OLED cell. The particularity is that only the light that propagates within a cone of ±36 degrees (when the refractive index n=1.7) gets out to the viewer, whereas the light generated by the recombination has all possible orientations.

The needed component should have a non-linear angular behavior. It should send within the solid angle cone of ±36 degrees some radiations which is incident from outside that cone within the layers.

For instance, a plane wave at 45 degrees from the normal of the cell shall be re-oriented within the ±36 degrees from the normal in order to get out.

There are then different strategies which can be sorted in two cases: if all incoming radiation, whatever their angle of propagation get all re oriented into the extracting cone. The second category: some of the radiation which are not within ±36 degrees, get reoriented within the cone. I'll explain it later, but the extraction strategies will be very different.

The right circular hollow cylinder proposed for example in FIGS. 3A-C, and the configuration proposed for example in FIG. 4 can provide such behavior.

Indeed, when such right circular hollow cylinder element is illuminated by a plane electromagnetic wave, at normal incidence, it transmits the radiation in the forward direction. The question is: how does it deal with non-normal plane wave incidence? We suppose that we have a plane wave at an angle θ with respect to the normal direction z and its direction of propagation will be in the plane z-x (no component along y). We will display the Poynting vector magnitude (absolute value of the electric field squared) in the x-z and y-z cross sections.

The FIGS. 9A-13,10A-13,11A-B and 12A-B present a comparison between the diffraction field pattern obtained from a non-normal plane-wave by an aperture of the same radius for angles of 30, 45, 60 and 80 degrees.

Indeed, FIGS. 9A and 9B present a cross-section of a diffraction field pattern generated, along a plane z-x, by an aperture, from an incident plane electromagnetic wave at an angle of 30° with respect to a normal direction z, respectively without a phase filter, and with a phase filter according to one embodiment of the disclosure.

Figure 10A:
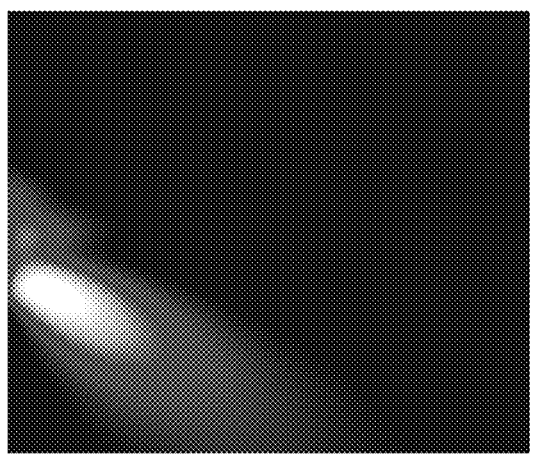
FIGS. 10A and 10B present a cross-section of a diffraction field pattern generated, along a plane z-x, by an aperture, from an incident plane electromagnetic wave at an angle of 45° with respect to a normal direction z, respectively without a phase filter, and with a phase filter according to one embodiment of the disclosure.
Figure 10B:
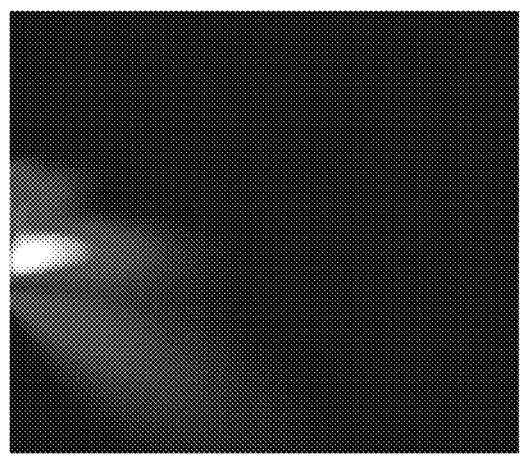

FIGS. 10A and 10B present a cross-section of a diffraction field pattern generated, along a plane z-x, by an aperture, from an incident plane electromagnetic wave at an angle of 45° with respect to a normal direction z, respectively without a phase filter, and with a phase filter according to one embodiment of the disclosure.

FIGS. 11A and 11B present a cross-section of a diffraction field pattern generated, along a plane z-x, by an aperture, from an incident plane electromagnetic wave at an angle of 60° with respect to a normal direction z, respectively without a phase filter, and with a phase filter according to one embodiment of the disclosure.

FIGS. 12A and 12B present a cross-section of a diffraction field pattern generated, along a plane z-x, by an aperture, from an incident plane electromagnetic wave at an angle of 80° with respect to a normal direction z, respectively without a phase filter, and with a phase filter according to one embodiment of the disclosure.

Without the phase filtering element (i.e. the right circular hollow cylinder element), the radiation basically stays of-axis and would not be reoriented, or at least a negligible fraction of the energy would spread by diffraction toward the extraction cone of a high-index media where the radiation is embedded. On the right-hand side, there are results when the aperture is provided by a ring-shaped phase retarder of a quarter wave. The figures have been calculated by the diffraction theory presented in previous sections. The phase filters very robustly (with the incidence angle) re-orient a great amount of the energy toward the normal. That energy will fall within the extraction cone of the dense media and instead of having no energy flowing out for those angles, there will be a great amount which will get outcoupled.

The figures show a cross-section of 3×3 μm.

Implementation of the Phase Filter (i.e. the Right Circular Hollow Cylinder Element) within an OLED Cell The simulations above have been made in a dielectric media of index 1.0. To keep the same behaviors, this means that the surrounding media must have the same index of refraction on both sides of the aperture. The phase filter shall preferably be embedded into the OLED structure.

As one part of the energy is transmitted in the extracting solid angle cone, whatever the angle of incidence, another part is not extracted, it is important that the later has a chance to be extracted at another moment and place of the pixel.

The OLED stack has in most of the cases a reflecting backplane, so that the energy that has not been extracted at the first hit on a phase filter will propagate within the stack towards the reflecting backplane, where it will again be re-oriented toward the place where there are some phase filters. It will then again have the chance to be diffracted within the solid angle cone of extraction and hence, at each round trip within the cell, it will get a new chance to be extracted. As the layers are absorption free, the only loss being at the metallic backplane, sooner or later, a big part of the energy that has been created by an electron-hole recombination will get out.

The FIG. 4 illustrates that phenomenon. The element referenced 401 is an OLED cell, although the proportions are not respected since it should be much wider than thicker. The right circular hollow cylinders referenced 402 are phase filters embedded in the structure. The space between the phase filter could be filled with a metallic reflector (one skilled in the art would know which metallic reflector can be used in such context). The arrow referenced 403 represents some radiation. Two cases can be distinguished:

1. The radiation hits the reflector between the phase filters or right circular hollow cylinders 403: It will be "recycled". This means that it is due for at least one more round trip in the cell before a new tentative to hit another phase filter.

2. The radiation hits a filter or right circular hollow cylinder 403:

a. One part of that radiation (arrow referenced 404) gets into the extracting solid angle and will leave the cell. An important feature of the phase filter is that this happens whatever the angle of incidence.

b. Another part (arrow referenced 405) is due, as in the case 1, to recycling phenomenon where it will have another chance to hit again the plane containing the phase filters and will fall again into the situation 1 or 2.

3. Recursively, almost all radiation emitted originally will be extracted.

The density of the phase filters (i.e. the number of right circular hollow cylinders in the diffusion layer) can be adjusted to maximize the previous recursive extraction.

The invention claimed is:

1. An organic light emitting diode (OLED) cell, comprising:
   a cathode;
   an anode, the anode being positioned on a substrate;
   between said cathode and said anode, an emissive layer and a conductive layer that generate light when a difference of potential occurs between said cathode and said anode; and
   a diffusion layer comprising a set of right circular hollow cylinders, each right circular hollow cylinder being defined by at least a parameter R, the parameter R defining an external radius, and a parameter r, the parameter r defining an internal radius, wherein the organic light emitting diode cell is configured to generate an electromagnetic wave having a wavelength $\lambda$, and wherein each right circular hollow cylinder is configured to function as a phase filter that changes an orientation of an incident plane electromagentic wave such that the set of right circular hollow cylinders disposed in the diffusion layer causes an amount of the generated light extracted from the organic light emitting diode cell to be increased.

2. The organic light emitting diode cell of claim 1, wherein said diffusion layer further comprises metallic reflectors that are positioned between said set of right circular hollow cylinders.

3. The organic light emitting diode cell of claim 1, further comprising a light emitting material layer positioned between said emissive layer and said conductive layer.

4. The organic light emitting diode cell of claim 3, wherein said light emitting material layer is configured to generate a monochromatic electromagnetic wave associated with said wavelength $\lambda$, and wherein said wavelength $\lambda$ is between 450 nm and 495 nm.

5. The organic light emitting diode cell of claim 3, wherein said light emitting material layer is configured to generate a polychromatic electromagnetic wave.

6. The organic light emitting diode cell of claim 1, further comprising a color filter or a color converter positioned at an edge of said diffusion layer.

7. The organic light emitting diode cell of claim 1, wherein each right circular hollow cylinder is made of a dielectric material in an internal part of the right circular hollow cylinder and is filled in with a gas in another part.

8. A display device, comprising:
   an organic light emitting diode (OLED) cell, wherein the organic light emitting diode cell is configured to generate an electromagnetic wave having a wavelength $\lambda$, the organic light emitting diode cell including:
   a cathode;
   an anode, the anode being positioned on a substrate;
   between said cathode and said anode, an emissive layer and a conductive layer that generate light when a difference of potential occures between said cathode and said anode; and
   a diffusion layer comprising a set of right circular hollow cylinders, each right circular hollow cylinder being defined by at least a parameter R, the parameter R defining an exteral radius, and a parameter r, the parameter r defining an internal radius, wherein each right circular hollow cylinder is configured to function as a phase filter that changes an orientation of an incident plane electrogmagnetic wave such that teh set of right circular hollow cylinders disposed in the diffusion layer causes an amount of the generated light extracted from the organic light emitting diode cell to be increased.

9. The display device of claim 8, wherein said diffusion layer further comprises metallic reflectors that are positioned between said set of right circular hollow cylinders.

10. The display device of claim 8, wherein the organic light emitting diode cell further includes a light emitting material layer positioned between said emissive layer and said conductive layer.

11. The display device of claim 10, wherein said light emitting material layer is configured to generate a monochromatic electromagnetic wave associated with said wavelength $\lambda$, and wherein said wavelength $\lambda$ between 450 nm and 495 nm.

12. The display device of claim 10, wherein said light emitting material layer is configured to generate a polychromatic electromagnetic wave.

13. The display device of claim 8, wherein the organic light emitting diode cell further includes a color filter or a color converter positioned at an edge of said diffusion layer.

14. The display device of claim 8, wherein each right circular hollow cylinder is made of a dielectric material in an internal part of the right circular hollow cylinder and is filled in with a gas in another part.

15. The organic light emitting diode cell of claim 1, wherein said parameter R is in a range $$\left[\lambda - \frac{30}{100}\lambda; \lambda + \frac{30}{100}\lambda\right].$$

16. The organic light emitting diode cell of claim 1, wherein said parameter r is defined such that a value of $$1 - \left(\frac{r}{R}\right)^2$$

is in a range [0.6; 0.8].

17. The organic light emitting diode cell of claim 1, wherein each right circular hollow cylinder has a height that is in a range $$\left[0.2\frac{\lambda}{n}; 0.4\frac{\lambda}{n}\right],$$

wherein n corresponds to a refractive index of said diffusion layer.

18. The display device of claim 8, wherein said parameter R is in a range $$\left[\lambda - \frac{30}{100}\lambda; \lambda + \frac{30}{100}\lambda\right].$$

19. The display device of claim 8, wherein said parameter r is defined such that a value of $$1 - \left(\frac{r}{R}\right)^2$$

is in a range [0.6; 0.8].

20. The display device of claim 8, wherein each right circular hollow cylinder has a height that is in a range $$\left[0.2\frac{\lambda}{n}; 0.4\frac{\lambda}{n}\right],$$

wherein n corresponds to a refractive index of said diffusion layer.

21. An organic light emitting diode (OLED) cell, comprising:
a cathode;
an anode, the anode being positioned on a substrate;
between said cathode and said anode, an emissive layer and a conductive layer that generate light when a difference of potential occurs between said cathode and said anode; and
a diffusion layer comprising a set of right circular hollow cylinders, each right circular hollow cylinder being defined by at least a parameter R, the parameter R defining an external radius, and a parameter r, the parameter r defining an internal radius, wherein the organic light emitting diode cell is configured to generate an electromagnetic wave having a wavelength λ, and wherein each right circular hollow cylinder has one or more of the following properties: (i) said parameter R is in a range $$\left[\lambda - \frac{30}{100}\lambda; \lambda + \frac{30}{100}\lambda\right],$$

(ii) said parameter r is defined such that a value of $$1 - \left(\frac{r}{R}\right)^2$$

is in a range [0.6; 0.8], and (iii) a height of the right circular hollow cylinder is in a range $$\left[0.2\frac{\lambda}{n}; 0.4\frac{\lambda}{n}\right],$$

wherein n corresponds to a refractive index of said diffusion layer.

22. A display device, comprising:
an organic light emitting diode (OLED) cell, wherein the organic light emitting diode cell is configured to generate an electromagnetic wave having a wavelength λ, the organic light emitting diode cell including:
a cathode;
an anode, the anode being positioned on a substrate;
between said cathode and said anode, an emissive layer and a conductive layer that generate light when a difference of potential occurs between said cathode and said anode; and
a diffusion layer comprising a set of right circular hollow cylinders, each right circular hollow cylinder being defined by at least a parameter R, the parameter R defining an external radius, and a parameter r, the parameter r defining an internal radius, wherein each right circular hollow cylinder has one or more of the following properties:
(i) said parameter R is in a range $$\left[\lambda - \frac{30}{100}\lambda; \lambda + \frac{30}{100}\lambda\right],$$

(ii) said parameter r is defined such that a value of $$1 - \left(\frac{r}{R}\right)^2$$

is in a range [0.6; 0.8], and (iii) a height of the right circular hollow cylinder is in a range $$\left[0.2\frac{\lambda}{n}; 0.4\frac{\lambda}{n}\right],$$

wherein n corresponds to a refractive index of said diffusion layer.

* * * * *